(12) United States Patent
Bedell et al.

(10) Patent No.: US 7,833,884 B2
(45) Date of Patent: Nov. 16, 2010

(54) STRAINED SEMICONDUCTOR-ON-INSULATOR BY SI:C COMBINED WITH POROUS PROCESS

(75) Inventors: Stephen W. Bedell, Wappingers Falls, NY (US); Joel P. de Souza, Putnam Valley, NY (US); Alexander Reznicek, Mount Kisco, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 11/934,479

(22) Filed: Nov. 2, 2007

(65) Prior Publication Data

US 2009/0117720 A1   May 7, 2009

(51) Int. Cl.
*H01L 21/20* (2006.01)
(52) U.S. Cl. .................................................... 438/479
(58) Field of Classification Search ................. 438/479
See application file for complete search history.

(56) References Cited

U.S. PATENT DOCUMENTS

| | | | |
|---|---|---|---|
| 7,172,930 B2 | 2/2007 | Adam et al. | |
| 2004/0245571 A1 | 12/2004 | Cheng et al. | |
| 2005/0056352 A1 | 3/2005 | Bedell et al. | |
| 2006/0003555 A1* | 1/2006 | Adam et al. | 438/479 |
| 2006/0081837 A1 | 4/2006 | Bedell et al. | |
| 2006/0157706 A1 | 7/2006 | Zhu et al. | |
| 2007/0111463 A1 | 5/2007 | Adam et al. | |
| 2007/0164356 A1* | 7/2007 | Adam et al. | 257/347 |

FOREIGN PATENT DOCUMENTS

WO   WO2004/073043 A2   8/2004

OTHER PUBLICATIONS

Matthews, J.W., "Defects associated with the accomodation of misfit between crystals" J. Vac. Sci. Technol., vol 12, No. 1, Jan./Feb. 1975 126-133.

* cited by examiner

*Primary Examiner*—Bradley K Smith
(74) *Attorney, Agent, or Firm*—Scully, Scott, Murphy & Presser, P.C.; Louis J. Percello, Esq.

(57) ABSTRACT

A method of fabricating a strained semiconductor-on-insulator (SSOI) substrate is provided. The method includes first providing a structure that includes a substrate, a doped and relaxed semiconductor layer on the substrate, and a strained semiconductor layer on the doped and relaxed semiconductor layer. In the invention, the doped and relaxed semiconductor layer having a lower lattice parameter than the substrate. Next, at least the doped and relaxed semiconductor layer is converted into a buried porous layer and the structure including the buried porous layer is annealed to provide a strained semiconductor-on-insulator substrate. During the annealing, the buried porous layer is converted into a buried oxide layer.

24 Claims, 3 Drawing Sheets

10

STRAINED SEMICONDUCTOR-ON-INSULATOR BY SI:C COMBINED WITH POROUS PROCESS

FIELD OF THE INVENTION

The present invention relates to a semiconductor substrate material and to a method of fabricating the same. More specifically, the present invention relates to a strained semiconductor-on-insulator (SSOI) substrate material and a robust method of fabricating the same that avoids wafer bonding.

BACKGROUND OF THE INVENTION

In the semiconductor industry, there has been an increasing interest in enhancing performance of complementary metal oxide semiconductor (CMOS) devices by replacing conventional silicon-on-insulator (SOI) substrates with strained semiconductor-on-insulator (SSOI) substrates. The reason behind this interest is that SSOI substrates provide higher carrier (electrons/holes) mobility than a conventional SOI substrate. The strain in the SSOI substrates can either be compressive or tensile.

Conventional methods to fabricate SSOI substrates typically require a layer transfer process wherein a strained Si-containing layer located on a relaxed SiGe layer is transferred onto a handle wafer. In particular, the conventional process includes first creating a relaxed SiGe layer of a few microns in thickness on a surface of a Si-containing substrate. The relaxed SiGe layer typically has an in-plane lattice parameter that is larger than that of Si. Next, a Si-containing layer is grown on the relaxed SiGe layer. Because the SiGe layer has a larger in-plane lattice parameter as compared to Si, the Si-containing layer is under strain.

The structure, including the strained Si-containing layer located on a relaxed SiGe layer, is then bonded to a handle wafer, which includes an insulating layer, such as an oxide layer. The bonding occurs between the strained Si-containing layer and the insulator layer. The Si-containing substrate and the relaxed SiGe layer are then typically removed from the bonded structure to provide a strained Si-on-insulator substrate.

The conventional SSOI substrate preparation method described above is quite expensive and low-yielding because it combines two rather advanced substrate technologies, i.e., high-quality, thick SiGe/strain Si growth, and wafer bonding. Moreover, the conventional preparation method is unattractive for manufacturing a large volume of substrates.

In view of the above, a cost effective and manufacturable solution to fabricate SSOI substrates is required for future high-performance Si-containing CMOS products.

Co-assigned U.S. Pat. No. 7,172,930 to Adams et al. provides one example of an alternative method that can be used in fabricating an SSOI substrate. The method disclosed in the '930 patent includes first providing a structure that contains a substrate, a relaxed semiconductor layer on the substrate, a doped and relaxed semiconductor layer on the relaxed semiconductor layer, and a strained semiconductor layer on the doped and relaxed semiconductor layer. Next, the doped and relaxed semiconductor layer beneath the strained semiconductor layer is converted into a buried porous layer and thereafter the structure including the buried porous layer is annealed to provide a strained semiconductor-on-insulator substrate. An electrolytic anodization process is disclosed in the '920 patent for forming the buried porous layer.

Despite the cost efficient and manufacturable solution provided for by the '920 patent there is still a need to provide other methods of forming SSOI substrates that are cost efficient, manufacturable, and avoid utilizing a wafer bonding processing step.

SUMMARY OF THE INVENTION

The present invention provides a cost-effective and manufacturable solution to produce SSOI substrates that avoids wafer bonding which is typically required in conventional technologies to produce SSOI substrate materials. The present invention also provides an alternative method to the process that is disclosed in the '920 patent mentioned above.

In broad terms, the method of the present invention comprises:

providing a structure that comprises a substrate, a doped and relaxed semiconductor layer on the substrate, and a strained semiconductor layer on the doped and relaxed semiconductor layer, said doped and relaxed semiconductor layer having a lower lattice parameter than said substrate;

converting at least the doped and relaxed semiconductor layer into a buried porous semiconductor layer; and annealing the structure including the buried porous semiconductor layer to provide a strained semiconductor-on-insulator substrate, wherein during said annealing the buried porous semiconductor layer is converted into a buried oxide layer.

In one embodiment of the present invention the providing step includes epitaxial growth of the doped and relaxed semiconductor layer and the strained semiconductor layer. Examples of epitaxial growth processes that can be employed in the present invention include rapid thermal chemical vapor deposition, low-energy plasma deposition, ultra-high vacuum chemical vapor deposition, atmospheric pressure chemical vapor deposition or molecular beam epitaxy.

In another embodiment of the present invention, the substrate is a crystalline semiconductor substrate including, for example, a Si-containing substrate. A highly preferred substrate of the invention is a crystalline silicon substrate.

In yet another embodiment of the present invention, the doped and relaxed semiconductor layer comprises a p-type dopant and the p-type dopant is present in the doped and relaxed semiconductor layer in a concentration from about 1E19 atoms/cm$^3$ or greater. In another highly preferred embodiment of the invention, the doped and relaxed semiconductor layer comprises Si:C.

In a further embodiment of the invention, the strained semiconductor layer is under a compressive or tensile strain. In yet another highly preferred embodiment of the invention, the strained semiconductor layer comprises silicon. In some embodiments, the strained semiconductor is a doped layer having a dopant concentration of about 1E15 atoms/cm$^3$ or greater.

In a preferred embodiment, the strained semiconductor layer is also converted into a porous semiconductor layer during said converting step. In such an embodiment, the porous semiconductor layer that is formed has a first porosity, while the buried porous semiconductor layer has a second porosity, wherein the first porosity is less than the second porosity. That is, the porous semiconductor layer that is formed has a finer porosity than the buried porous semiconductor layer. The degree of porosity is determined by the doping level in both the strained semiconductor layer and the doped and relaxed semiconductor layer; a higher doping concentration will provide higher (coarser) porosity. During the subsequent anneal step, the finer pores of the porous semiconductor layer close, while the coarse porous semiconductor material is oxidized.

In some further embodiments, the buried porous layer contains C precipitates.

In a yet further embodiment of the invention, the doped and relaxed semiconductor layer and the strained semiconductor layer have a (100), (110) or (111) crystal orientation. It is noted that since epitaxial growth is employed in forming the doped and relaxed semiconductor layer and the strained semiconductor layer, those layers have the same crystal orientation as that of the substrate.

In an even further embodiment of the invention, the strained semiconductor layer is patterned via lithography and etching prior to said converting step.

In a yet even further embodiment of the present invention, the converting step employed comprises an electrolytic anodization process. The electrolytic anodization process is typically performed in the presence of a HF-containing solution. The converting step provides a buried porous semiconductor layer that typically, but not necessarily always, has a porosity of about 10% or greater. The porosity of the porous semiconductor layer formed atop the buried porous semiconductor layer is less than 10%.

In other embodiments of the invention, annealing is performed in an oxygen-containing ambient that can optionally include an inert gas. The annealing in the oxygen-containing ambient typically forms a surface oxide layer atop the strained semiconductor layer, which may or may not be removed from the structure during subsequent processing steps.

In some embodiments of the invention, the method further includes a baking step which reduces dopants present in the strained semiconductor-on-insulator substrate. Typically, the baking step is performed in hydrogen.

In a highly preferred aspect of the invention, the method includes the steps of:

epitaxially growing a strained silicon layer on a surface of an epitaxial doped and relaxed Si:C layer, said doped and relaxed Si:C located atop a silicon substrate;

electrolytically anodizing said strained silicon layer and said doped and relaxed Si:C layer to convert said strained silicon layer into a porous semiconductor layer having a first porosity and said doped and relaxed Si:C layer into a buried porous semiconductor layer of a second porosity, wherein said first porosity is less than the second porosity; and annealing said porous semiconductor layer and said buried porous semiconductor layer in an oxidizing ambient, whereby said porous semiconductor layer is converted into a strained silicon single crystal layer and said buried porous semiconductor layer is converted to a buried oxide layer that is located between said strained silicon single crystal layer and said silicon substrate.

The inventive method which utilizes a relaxed and doped semiconductor layer having a lower lattice parameter than the underlying substrate as a template for strained semiconductor growth with subsequent consumption of the doped and relaxed semiconductor layer by porosification has the following advantages over comparable prior art methods: (i) it creates a single wafer SSOI which avoids the need of a costly wafer bonding process, and (ii) it creates a material system which is compatible with CMOS process integration.

DETAILED DESCRIPTION OF THE INVENTION

Figure 1A:
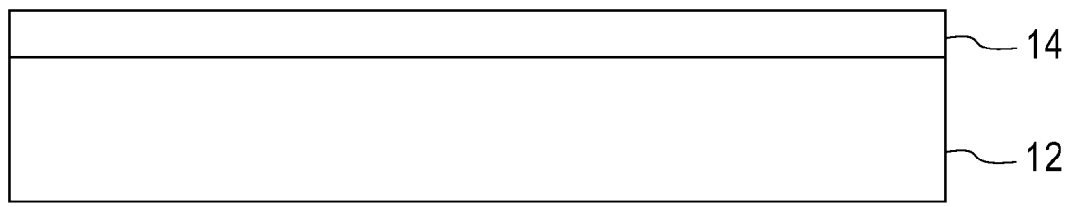
FIGS. 1A-1E are pictorial representations (through cross sectional views) illustrating the basic processing steps employed in fabricating the inventive SSOI substrate. The inventive SSOI substrate shown in these drawings contains a strained semiconductor layer and a buried oxide that are both unpatterned.

The present invention, which provides a method of fabricating an SSOI substrate, will now be described in more detail by referring to the drawings that accompany the present application. In the accompanying drawings, like and corresponding elements are referred to by like reference numerals. It is also noted that the drawings of the present invention representing the structures during the various processing steps of the present invention are provided for illustrative purposes and are thus not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, a method of fabricating a strained semiconductor-on-insulator (SSOI) substrate is provided. The method includes first providing a structure that includes a substrate, a doped and relaxed semiconductor layer on the substrate, and a strained semiconductor layer on the doped and relaxed semiconductor layer. In the invention, the doped and relaxed semiconductor layer has a lower lattice parameter than the substrate. Next, at least the doped and relaxed semiconductor layer is converted into a buried porous semiconductor layer and the structure including the buried porous semiconductor layer is annealed to provide a strained semiconductor-on-insulator substrate. During annealing, the buried porous semiconductor layer is converted into a buried oxide layer.

The method of the present invention begins with first providing the structure 10 shown, for example, in FIG. 1A. Structure 10 includes a substrate 12 and a doped and relaxed semiconductor layer 14 having a lower lattice parameter than the substrate 12. In accordance with the present invention, substrate 12 and layer 14 have the same crystallographic orientation since layer 14 is formed on a surface of substrate 12 by epitaxial growth.

Examples of various epitaxial growth processes that are employed in the present invention include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

The substrate 12 employed in the present invention may be comprised of any material or material layers including, for example, crystalline glass or a metal, but preferably the substrate 12 is a crystalline semiconductor substrate. Examples of semiconductor substrates that can be employed as substrate 12 include, but are not limited to: Si, SiGe, SiC, SiGeC, GaAs, InAs, InP, and other III/IV or II/VI compound semiconductors. The term "semiconductor substrate" also includes preformed silicon-on-insulator (SOI) or SiGe-on-insulator (SGOI) substrates which may include any number of buried insulating (continuous, non-continuous or a combination of continuous and non-continuous) regions therein. In one preferred embodiment, the substrate 12 is a Si-containing substrate. The substrate 12 may be undoped or it may be an electron rich or hole-rich substrate, i.e., doped substrates.

A doped and relaxed semiconductor layer 14 is formed above its critical thickness on an exposed upper surface of the substrate 12. By "critical thickness" it is meant a thickness greater than that which renders the film susceptible to relaxation through the formation of dislocations. The critical thickness for a given amount of strain can be calculated using the expression given by Matthews (J. W. Matthews, J. Vac. Sci. Technol, 12 126-33 (1975)). The doped and relaxed semiconductor layer 14 employed in the present invention has an in-plane lattice parameter that is smaller than that of substrate 12.

The doped and relaxed semiconductor layer 14 includes a semiconductor material having a lattice parameter that is less than the lattice parameter of substrate 12. The doped and relaxed semiconductor layer 14 includes a p-type dopant such as, for example, Ga, Al and B. High p-type doping in the doped and relaxed semiconductor layer 14 is required in the present invention. By "high" p-type dopant it is meant, a p-type dopant concentration of about 1E19 atoms/cm$^3$ or greater, with a p-type dopant concentration from about 4E19 to about 1E20 atoms/cm$^3$ being even more typical.

The semiconductor material of the doped and relaxed semiconductor layer 14 typically includes Si:C. In a highly preferred embodiment of the present invention, and when the substrate 12 comprises silicon, the doped and relaxed semiconductor layer 14 comprises Si:C. In the preferred embodiment, the carbon content within the semiconductor layer 14 is typically from about 0.05 to about 10 atomic %, with a carbon content from about 1 to about 4 atomic % being even more typical.

In accordance with the present invention, the doped and relaxed semiconductor layer 14 is a layer that is more heavily doped than the surrounding layers, i.e., substrate 12 and strained semiconductor layer 16 to be subsequently formed. As stated above, the doped and relaxed semiconductor layer 14 is formed using one of the above mentioned epitaxial growth processes in which the dopant source is included with the semiconductor source.

The doped and relaxed semiconductor layer 14 employed in the present invention is a thin layer whose thickness will define the thickness of the buried oxide layer to be subsequently formed. Typically, the doped and relaxed semiconductor layer 14 has a thickness from about 1 to about 1000 nm, with a thickness from about 10 to about 200 nm being more typical.

After forming the doped and relaxed semiconductor layer 14, a strained semiconductor layer 16 is formed on top of the doped and relaxed semiconductor layer 14 using one of the above-mentioned epitaxial growth processes. The structure including the strained semiconductor layer 16 is shown, for example, in FIG. 1B. The strained semiconductor layer 16 may be comprised of one of the semiconductor materials mentioned above in connection with substrate 12. In a highly preferred embodiment, the stained semiconductor layer 16 comprises Si. The strained Si layer is typically used with a doped and relaxed Si:C layer and a silicon substrate. The strained semiconductor layer 16 can have a tensile or compressive stress.

It is noted that the growth of layers 14 and 16 may occur using the same or different epitaxial growth process. Moreover, it is also contemplated to form layers 14 and 16 in the same reactor chamber without breaking vacuum.

The strained semiconductor layer 16 may be doped or undoped. When doped, the strained semiconductor layer 16 typically has a dopant concentration of about 1E15 atoms/cm$^3$ or greater. The thickness of layer 16 is typically from about 20 to about 2000 nm, with a thickness from about 50 to about 200 nm being more typical.

In a highly preferred embodiment of the present invention, the strained semiconductor layer 16 is a doped layer having a dopant concentration of about 1E15 atoms/cm$^3$ or greater.

In accordance with the present invention, layers 14 and 16 have the same crystallographic orientation as substrate 12 since the various layers are formed by epitaxial growth. Hence, layers 14 and 16 can have a (100), (110), (111) or any other crystallographic orientation.

Figure 1B:
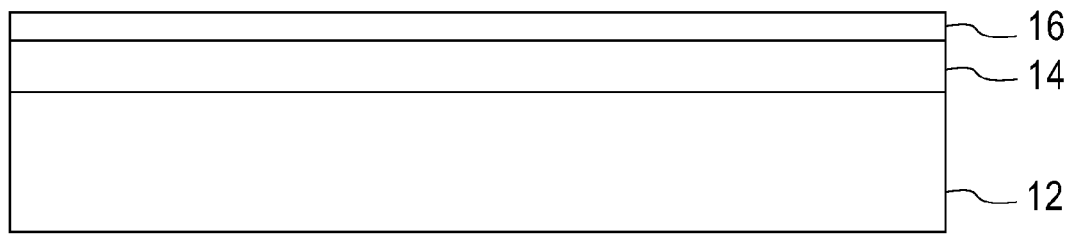
Figure 1C:
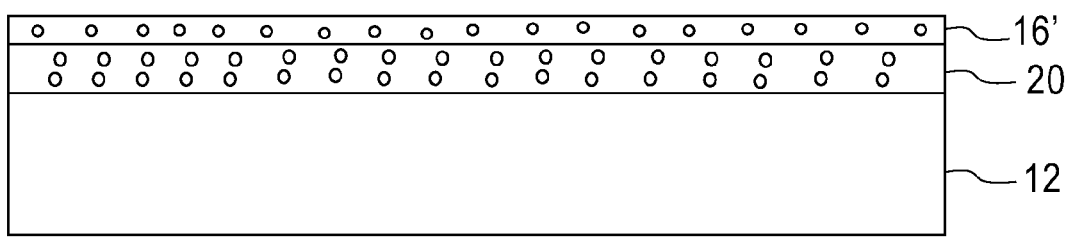

Next, the structure shown in FIG. 1B is subjected to an electrolytic anodization process that is capable of converting at least the doped and relaxed semiconductor layer 14 into a buried porous semiconductor layer 20. In some embodiments, when the strained semiconductor layer 16 is doped, the doped strained semiconductor layer is also converted into a porous semiconductor layer. FIG. 1C illustrates such an embodiment, and in the drawing reference numeral 16' denotes the porous semiconductor layer that is derived from doped strained semiconductor layer 16. In the present invention, the porous semiconductor layer 16' has a first porosity and the buried porous semiconductor layer 20 has a second porosity, wherein the first porosity is less than the second porosity. The structure, after the electrolytic anodization process has been performed, is shown, for example in FIG. 1C.

The anodization process is performed by immersing the structure shown in FIG. 1B into an HF-containing solution while an electrical bias is applied to the structure with respect to an electrode also placed in the HF-containing solution. In such a process, the structure typically serves as the positive electrode of the electrochemical cell, while another semiconducting material such as Si, or a noble metal is employed as the negative electrode.

In general, the HF anodization converts the doped and relaxed semiconductor layer 14 into a buried porous semiconductor layer 20. In some embodiments, the strained semiconductor layer 16 is also converted into a porous semiconductor layer 16'. The rate of formation and the nature of the buried porous semiconductor layer 20 (and optionally the overlying porous semiconductor layer 16') so-formed (porosity and microstructure) is determined by both the material properties, i.e., doping type and concentration, as well as the reaction conditions of the anodization process itself (current density, bias, illumination and additives in the HF-containing solution). Generally, the buried porous semiconductor layer 20 formed in the present invention has a porosity of about 10% or higher, while the porous semiconductor layer 16' located atop the buried porous semiconductor layer 20 has a porosity of less than 10%.

The term "HF-containing solution" includes concentrated HF (49%), a mixture of HF and water, a mixture of HF and a monohydric alcohol such as methanol, ethanol, propanol, etc, or HF mixed with at least one surfactant. The amount of surfactant that is present in the HF solution is typically from about 1 to about 50%, based on 49% HF.

The anodization process, which is used in forming the porous semiconductor layers, is performed using a constant current source that operates at a current density from about 0.05 to about 50 mA/cm$^2$. A light source may be optionally used to illuminate the sample. More preferably, the anodization process of the present invention is employed using a constant current source operating at a current density from about 0.1 to about 5 mA/cm$^2$.

The anodization process is typically performed at room temperature or, a temperature that is elevated from room temperature may be used. Following the anodization process, the structure is typically rinsed with deionized water and dried. Anozidation typically occurs for a time period of less than about 10 minutes, with a time period of less than 1 minute being more typical.

Figure 1D:
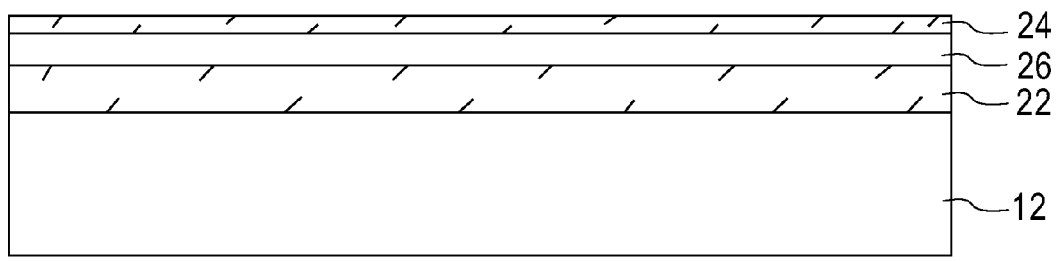

The structure shown in FIG. 1C including the buried porous semiconductor layer 20 and the overlying porous semiconductor layer 16' (it is noted the porous semiconductor layer 16' is strained) is then heated, i.e., annealed, at a temperature which converts the porous semiconductor layer 16' into a strained semiconductor single crystal layer 26 and the buried porous semiconductor layer 20 into a buried oxide layer 22. The resultant structure is shown, for example, in FIG. 1D. As shown, the structure includes a strained semiconductor single crystal layer 26 atop a buried oxide layer 22. The buried oxide layer 22 is located on a surface of the substrate 12.

Figure 1E:
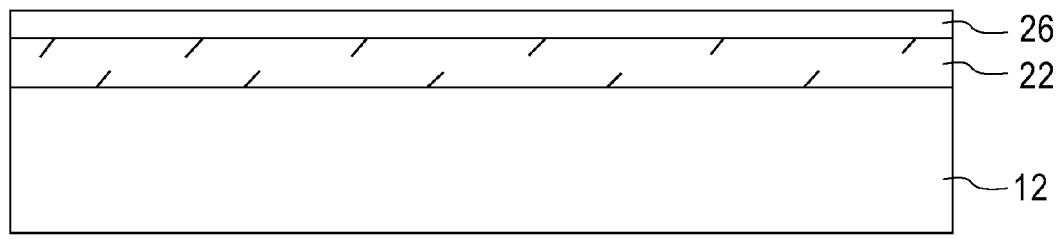

Note that an oxide layer 24 is formed atop layer 26 during the heating step. This surface oxide layer, i.e., oxide layer 24, is typically, but not always, removed from the structure after the heating step using a conventional wet etch process wherein a chemical etchant such as HF that has a high selectivity for removing oxide as compared to semiconductor is employed. The structure, without the surface oxide layer 24, is shown in FIG. 1E.

In some embodiments of the present invention, multiple buried oxide layers can be obtained by forming continuous layers of materials 14 and 16 on substrate 12 and then performing the electrolytic anodization process and annealing process of the present invention.

The surface oxide layer 24 formed after the heating step of the present invention has a variable thickness which may range from about 10 to about 1000 nm, with a thickness of from about 20 to about 200 nm being more highly preferred. Buried oxide layer 22 typically has the same thickness as previously described for the doped and relaxed semiconductor layer 14.

Specifically, the heating step of the present invention is an annealing step which is performed at a temperature that is greater than 400° C., preferably greater than 1100° C. A typical temperature range for the heating step of the present invention is from about 1200° to about 1320° C.

Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. Alternatively, the oxygen-containing gas may be mixed with water vapor or moisture. When a diluted ambient is employed, the diluted ambient contains from about 0.1 to about 100% of oxygen-containing gas, the remainder, up to 100%, being inert gas.

The heating step may be carried out for a variable period of time that typically ranges from greater than 0 minutes to about 1800 minutes, with a time period from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of oxide layers, i.e., layers 22 and 24. Note that the buried porous semiconductor region reacts with diffused oxygen at an enhanced rate.

After heating, and subsequent removal of surface oxide layer 24, the structure can be subjected to a thermal process (i.e., baking step) that is capable of reducing the content of dopants present in the final structure. The baking step is typically performed in the presence of a hydrogen-containing ambient such as $H_2$. Leaching of dopants from the structure typically occurs when this step is performed at a temperature that is greater than 800° C., with a temperature of greater than 1000° C. being more typical. This thermal step is optional and does not need to be performed in all instances. Leaching of dopants using the thermal treatment process can be performed for any desired period of time.

Typically, the thermal process, which leaches dopants from the structure, is performed for a time period from about 1 to about 60 minutes. As stated above, this baking step reduces the amount of dopant within the SSOI substrate. Although it can be used to reduce any dopant within the SSOI substrate, it is particularly employed to remove boron from the structure.

After performing the above processing steps, conventional CMOS process can be carried out to form one or more CMOS devices such as field effect transistors (FETs) atop the strained semiconductor layer. The CMOS processing is well known to those skilled in the art; therefore details concerning that processing are not needed herein.

The method of the present invention described above provides an SSOI substrate including a strained semiconductor single crystal layer 26 atop an oxide layer 22, the oxide layer 22 is located on a surface of the substrate 12. The oxide layer 22 that is formed by the inventive method is of 'high-quality' meaning that the buried oxide layer 22 has a leakage of about 1 microampere or less and a breakdown field of about 2 Megavolts or greater.

The embodiment depicted in FIGS. 1A-1E illustrates the case wherein no layers are patterned. In another embodiment, it is also contemplated to form a structure that includes a patterned strained semiconductor layer 26 on a buried oxide layer 22. One such patterned SSOI structure is shown, for example, in FIG. 2. The patterned structure is formed using the same basic processing steps as described above except that prior to anodization the strained semiconductor layer 16, shown, for example, in FIG. 1B, is patterned by lithography and etching. The lithography step includes applying a photoresist on the strained semiconductor layer 16, exposing the photoresist to a pattern of radiation and developing the patterned into the exposed photoresist by utilizing a conventional resist developer. The etching step can include a wet etch process or a dry etching process that selectively removes the exposed strained semiconductor layer 16. After stripping the patterned photoresist from the structure, anodization and oxidation, as described above, are performed.

Figure 2:
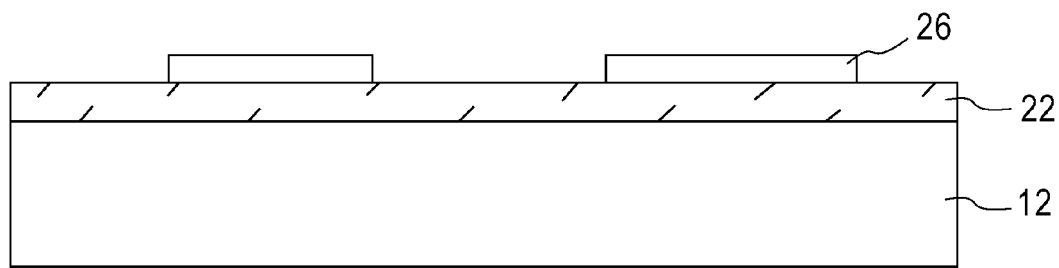
FIG. 2 is a pictorial representation (through cross-sectional views) illustrating a patterned SSOI substrate that is fabricated using the method of the present invention.

In yet another embodiment of the present invention, a patterned SSOI substrate as shown in FIG. 2 can be formed by first conducting the processing steps of epitaxial growth, anodization and oxidation, and then patterning the structure by lithography and etching.

In some further embodiments, the buried oxide layer 22 can be patterned as well. In such an embodiment, the buried oxide layer 22 can be patterned before anodization (utilizing the above processing steps except that etching continues into the doped and relaxed semiconductor layer 14) or after anodization and annealing.

CMOS processing which is well known to those skilled in the art (and as such is not described in greater detail in this application) can also be performed on the patterned SSOI substrate as well.

Figure 3:
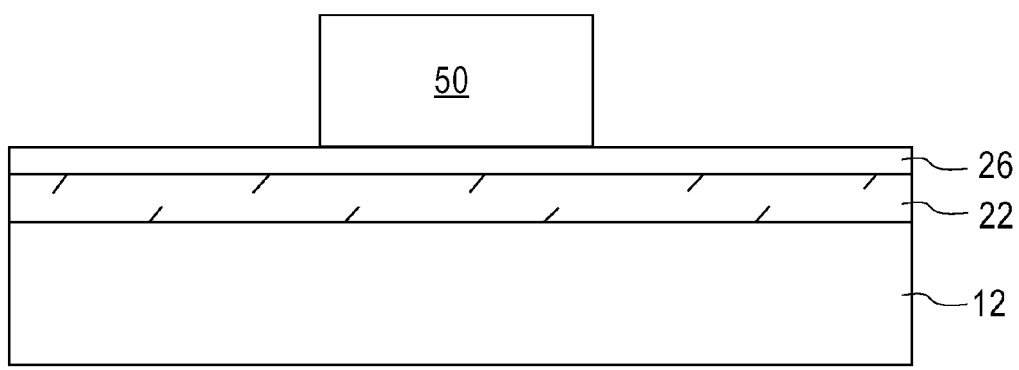
FIG. 3 is a pictorial representation (through a cross sectional view) depicting at least one semiconductor device located on the strained semiconductor layer of the SSOI substrate fabricated in FIGS. 1A-1E.

FIG. 3 is a pictorial representation (through a cross sectional view) depicting at least one semiconductor device 50 located on the strained semiconductor layer of the SSOI substrate fabricated in FIGS. 1A-1E. The at least one semiconductor device 50 may comprise, for example, a field effect transistor, a bipolar transistor, a combined field effect transistor and a bipolar transistor, a capacitor, or any combination thereof.

While the present invention has been particularly shown and described with respect to preferred embodiments thereof, it will be understood by those skilled in the art that the foregoing and other changes in forms and details may be made without departing from the scope and the spirit of the present invention. It is therefore intended that the present invention not be limited to the exact forms and details described and illustrated, but fall within the scope of the appended claims.

What is claimed is:

1. A method of fabricating a strained semiconductor-on-insulator (SSOI) substrate comprising:
providing a structure that comprises a substrate, a doped and relaxed semiconductor layer comprising Si:C located directly on an upper surface of the substrate, said Si:C contains 0.05 to 10 atomic percent C, and a strained semiconductor layer on the doped and relaxed semiconductor layer, said doped and relaxed semiconductor layer having a lower lattice parameter than said substrate;
converting at least the doped and relaxed semiconductor layer into a buried porous semiconductor layer; and
annealing the structure including the buried porous semiconductor layer to provide a strained semiconductor-on-insulator substrate, wherein during said annealing the buried porous semiconductor layer is converted into a buried oxide layer which is located directly on said upper surface of the substrate.

2. The method of claim 1 wherein the providing step includes epitaxial growth of said doped and relaxed semiconductor layer and said strained semiconductor layer.

3. The method of claim 2 wherein said epitaxial growth comprises rapid thermal chemical vapor deposition, low-energy plasma deposition, ultra-high vacuum chemical vapor deposition, atmospheric pressure chemical vapor deposition or molecular beam epitaxy.

4. The method of claim 1 wherein said substrate is a crystalline semiconductor substrate.

5. The method of claim 4 wherein said crystalline semiconductor substrate is a Si-containing substrate.

6. The method of claim 1 wherein the doped and relaxed semiconductor layer comprises a p-type dopant.

7. The method of claim 6 wherein said p-type dopant is present in said doped and relaxed semiconductor layer in a concentration from about 1E19 atoms/cm$^3$ or greater.

8. The method of claim 1 wherein said strained semiconductor layer is under a compressive or tensile stress.

9. The method of claim 1 wherein said strained semiconductor layer comprises silicon.

10. The method of claim 1 wherein said strained semiconductor layer is a doped layer having a dopant concentration of about 1E15 atoms/cm$^3$ or greater and during said converting said strained semiconductor layer is converted to a porous semiconductor layer located atop the buried porous semiconductor layer, wherein said porous semiconductor layer has a porosity that is less than a porosity of said buried porous semiconductor layer.

11. The method of claim 1 wherein said doped and relaxed semiconductor layer and said strained semiconductor layer have a (100), (110) or (111) crystal orientation.

12. The method of claim 1 further comprising patterning said strained semiconductor layer prior to said converting step.

13. The method of claim 1 wherein said converting step comprises an electrolytic anodization process.

14. The method of claim 13 wherein said electrolytic anodization process is performed in the presence of a HF-containing solution.

15. The method of claim 1 wherein the porous semiconductor layer has a porosity of about 10% or greater.

16. The method of claim 1 wherein said annealing is performed in an oxygen-containing ambient that can optionally include an inert gas.

17. The method of claim 1 further comprising a baking step which reduces dopants present in said strained semiconductor-on-insulator substrate.

18. The method of claim 17 wherein said baking step is performed in hydrogen.

19. A method of fabricating a strained semiconductor-on-insulator substrate comprising:
epitaxially growing a strained silicon layer on a surface of an epitaxial doped and relaxed Si:C layer, said doped and relaxed Si:C contains from 0.05 to 10 atomic percent C and is located directly on an upper surface of a silicon substrate;
electrolytically anodizing said strained silicon layer and said doped and relaxed Si:C layer to convert said strained silicon layer into a porous semiconductor layer having a first porosity and said doped and relaxed Si:C layer into a buried porous semiconductor layer of a second porosity, wherein said first porosity is less than the second porosity; and
annealing said porous semiconductor layer and said buried porous semiconductor layer in an oxidizing ambient, whereby said porous semiconductor layer is converted into a strained silicon single crystal layer and said buried porous semiconductor layer is converted to a buried oxide layer that is located between said strained silicon single crystal layer and said silicon substrate, said buried oxide layer is located directly on said upper surface of said silicon substrate.

20. The method of claim 19 wherein said electrolytic anodization process is performed in the presence of a HF-containing solution.

21. The method of claim 19 wherein the buried porous semiconductor layer has a porosity of about 10% or greater.

22. The method of claim 19 wherein said annealing is performed in an oxygen-containing ambient that can optionally include an inert gas.

23. The method of claim 19 further comprising a baking step which reduces dopants present in said strained semiconductor-on-insulator substrate.

24. The method of claim 23 wherein said baking step is performed in hydrogen.

* * * * *